United States Patent
Kwack et al.

(10) Patent No.: US 8,895,987 B2
(45) Date of Patent: Nov. 25, 2014

(54) ARRAY SUBSTRATE FOR FRINGE FIELD SWITCHING MODE LIQUID CRYSTAL DISPLAY DEVICE AND METHOD OF FABRICATING THE SAME

(71) Applicant: LG Display Co., Ltd., Seoul (KR)

(72) Inventors: Hee-Young Kwack, Paju-si (KR); Sang-Uk Ahn, Goyang-si (KR); Jin-Hee Jang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/098,843

(22) Filed: Dec. 6, 2013

(65) Prior Publication Data

US 2014/0175442 A1 Jun. 26, 2014

(30) Foreign Application Priority Data

Dec. 24, 2012 (KR) .......................... 10-2012-0152244

(51) Int. Cl.
*H01L 29/04* (2006.01)
*G02F 1/1362* (2006.01)
*H01L 27/12* (2006.01)

(52) U.S. Cl.
CPC ........ *G02F 1/136286* (2013.01); *H01L 27/124* (2013.01); *H01L 27/1259* (2013.01)
USPC .............................................. 257/59; 438/151

(58) Field of Classification Search
CPC .......................... H01L 27/1259; H01L 27/124
USPC .............................................. 257/59; 438/151
See application file for complete search history.

(56) References Cited

U.S. PATENT DOCUMENTS

| | | | | |
|---|---|---|---|---|
| 2009/0322975 A1* | 12/2009 | Song et al. | ...................... | 349/46 |
| 2011/0080549 A1* | 4/2011 | Jung et al. | ...................... | 349/141 |
| 2012/0268396 A1* | 10/2012 | Kim et al. | ...................... | 345/173 |
| 2013/0214299 A1* | 8/2013 | Ryu et al. | ......................... | 257/88 |
| 2013/0248870 A1* | 9/2013 | Jung et al. | ....................... | 257/59 |

* cited by examiner

*Primary Examiner* — Trung Q Dang
(74) *Attorney, Agent, or Firm* — Brinks Gilson & Lione

(57) ABSTRACT

An array substrate for an FFS mode LCD device includes a gate line and a gate pad electrode on a substrate; a common line parallel to the gate line; a data line extending along a second direction in a display area and a data pad electrode disposing in a non-display area; a thin film transistor electrically connected to the gate and data lines; a first passivation layer covering the thin film transistor and the data line; a second passivation layer on the first passivation layer and having a first thickness in the display area and a second thickness in the non-display area; a common electrode on the second passivation layer and connected to the common line; a third passivation layer on the common electrode; and a pixel electrode, a gate auxiliary pad electrode and a data auxiliary pad electrode on the third passivation layer.

9 Claims, 18 Drawing Sheets

ARRAY SUBSTRATE FOR FRINGE FIELD SWITCHING MODE LIQUID CRYSTAL DISPLAY DEVICE AND METHOD OF FABRICATING THE SAME

This application claims the benefit of priority to Korean Patent Application No. 10-2012-0152244 filed in Korea on Dec. 24, 2012, which is hereby incorporated by reference for all purposes as if fully set forth herein.

BACKGROUND

1. Field of the Disclosure

The disclosure relates to a liquid crystal display device, and more particularly, to an array substrate for a fringe field switching (FFS) mode liquid crystal display (LCD) device and a method of manufacturing the same.

2. Discussion of the Related Art

Liquid crystal display (LCD) devices are driven based on optical anisotropy and polarization characteristics of a liquid crystal material. The LCD devices have been widely used for display units of portable electronic devices, monitors of personal computers, or televisions.

Liquid crystal molecules have a long and thin shape, and the liquid crystal molecules are regularly arranged along in an alignment direction. Light passes through the LCD device along the long and thin shape of the liquid crystal molecules. The alignment of the liquid crystal molecules depends on the intensity or the direction of an electric field applied to the liquid crystal molecules. By controlling the intensity or the direction of the electric field, the alignment of the liquid crystal molecules is controlled to display images.

Generally, an LCD device includes two substrates, which are spaced apart and facing each other, and a liquid crystal layer is interposed between the two substrates. Each of the substrates includes an electrode. The electrodes from respective substrates face one another. An electric field is induced between the electrodes by applying a voltage to each electrode. An alignment direction of liquid crystal molecules changes in accordance with a variation in the intensity or the direction of the electric field.

However, since the LCD device uses a vertical electric field that is perpendicular to the substrates, the LCD device has poor viewing angles.

To resolve the poor viewing angles, an in-plane switching (IPS) mode liquid crystal display (LCD) device has been suggested.

In an IPS mode LCD device, a pixel electrode and a common electrode are alternately disposed on the same substrate, and a horizontal electric field that is parallel to the substrate is induced between the pixel electrode and the common electrode. Liquid crystal molecules are driven by the horizontal electric field and move parallel to the substrate. Accordingly, the IPS mode LCD device has the improved viewing angles.

However, the IPS mode LCD device has disadvantages of low aperture ratio and transmittance. To solve the disadvantages of the IPS mode LCD device, a fringe field switching (FFS) mode LCD device has been suggested.

FIG. 1 is a cross-sectional view of illustrating a pixel region of an array substrate for a related art FFS mode LCD device, FIG. 2 is a cross-sectional view of illustrating a region for a common contact hole of the array substrate of the related art, and FIG. 3 is a cross-sectional view of illustrating a pad area for a data pad electrode of the array substrate of the related art.

In FIG. 1, FIG. 2 and FIG. 3, a gate line (not shown), a gate electrode 5 and a common line 7 are formed on a transparent insulating substrate 1. As not shown in the figures, a gate pad electrode is connected to one end of the gate line.

A gate insulating layer 10 is formed on the gate line, the gate electrode 5, the common line 7, and the gate pad electrode all over the substrate 1.

A semiconductor layer 20 including an active layer 20a and ohmic contact layers 20b is formed over the gate insulating layer 10 corresponding to the gate electrode 5, and source and drain electrodes 33 and 36 spaced apart from each other are formed over the semiconductor layer 20. A data line (not shown) is formed over the gate insulating layer 10. The data line crosses the gate line to define a pixel region P. A data pad electrode 31 is formed in a pad area PA and is connected to one end of the data line. A semiconductor dummy pattern 21 including a first pattern 21a and a second pattern 21b is formed under the data pad electrode 31.

The gate electrode 5, the semiconductor layer 20, the source electrode 33 and the drain electrode 36 constitute a thin film transistor Tr.

A first passivation layer 40 of an inorganic insulating material is formed on the data line, the data pad electrode 31, and the source and drain electrodes 33 and 36. A second passivation layer 50 of an organic insulating material is formed on the first passivation layer 40 and has a flat top surface. The second passivation layer 50 is removed in the pad area PA.

A common contact hole 55 is formed in the first and second passivation layers 40 and 50 and the gate insulating layer 10 and exposes the common line 7.

A common electrode 60 is formed on the second passivation layer 50 and is connected to the common line 7 through the common contact hole 55. The common electrode 60 has a first opening op1 corresponding to a switching area TrA in the pixel region P.

A third passivation layer 63 of an inorganic insulating material is formed on the common electrode 60. Since the second passivation layer 63 is removed in the pad area PA, the third passivation layer 63 is formed directly on the first passivation layer 40 in the pad area PA.

A drain contact hole 68 is formed in the first, second and third passivation layers 40, 50 and 63 and exposes the drain electrode 36 of the thin film transistor Tr.

A pixel electrode 70 of a transparent conductive material is formed on the third passivation layer 63 in the pixel region P and is connected to the drain electrode 36 through the drain contact hole 68. The pixel electrode 70 includes a plurality of second openings op2, which each have a bar shape and are spaced apart from each other.

The array substrate for a related art FFS mod LCD device is manufactured by seven mask processes. A method of manufacturing the array substrate will be briefly explained.

FIGS. 4A to 4C are cross-sectional views of illustrating a pixel region of an array substrate for a related art FFS mode LCD device in steps of manufacturing the same, FIGS. 5A to 5C are cross-sectional views of illustrating a region for a common contact hole of the array substrate in steps of manufacturing the same, and FIGS. 6A to 6C are cross-sectional views of illustrating a pad area for a data pad electrode of the array substrate in steps of manufacturing the same. FIGS. 4A to 4C, FIGS. 5A to 5C, and FIGS. 6A to 6C show steps of forming first and second passivation layers on a substrate.

In FIG. 4A, FIG. 5A and FIG. 6A, a gate line (not shown), a gate pad electrode (not shown), a common line 7 and a gate electrode 5 are formed on a first substrate in a first mask process. A gate insulating layer 10 is formed on the gate line, the gate pad electrode, the common line 7 and the gate electrode 5 all over the substrate 1. A data line (not shown), a data pad electrode 31, source and drain electrodes 33 and 36, and a semiconductor layer 20 are formed over the gate insulating layer 10 in a second mask process. The data line and the data pad electrode 31 are disposed directly on the gate insulating layer 10. The semiconductor layer 20 and the source and drain electrodes 33 and 35 are sequentially on the gate insulating layer 10 corresponding to the gate electrode 5.

Next, a first passivation layer 40 of an inorganic insulating material is formed on the data line, the data pad electrode 31, and the source and drain electrodes 33 and 36 all over the substrate 1.

Then, a second passivation layer 50 of an organic insulating material is formed on the first passivation layer 40 and has a flat top surface. The second passivation layer 50 is patterned in a third mask process, thereby forming a first hole hl1 and a second hole hl2 exposing the first passivation layer 40 corresponding to the drain electrode 36 and the common line 7, respectively, and exposing the first passivation layer 40 in a pad area PA where the data pad electrode 31 is formed and in a gate pad area (not shown) where the gate pad electrode is formed.

If the second passivation layer 50 remains in the gate pad area and the pad area PA, gate and data auxiliary pad electrodes, which are formed later, should be formed too deeply due to the second passivation layer 50, or diameters of pad contact holes exposing the gate and data pad electrodes increase because of a thickness of the second passivation layer 50. In this case, when a printed circuit board is connected to the gate and data auxiliary pad electrodes, conductivity is lowered because conductive balls in an anisotropic conductive film (ACF) used as an adhesive do not break, or stability in electrical connection between the array substrate and the printed circuit board declines because the conductive balls go into the pad contact holes. Thus, to prevent the problems, the second passivation layer 50 is removed in the pad area PA and the gate pad area.

In FIG. 4B, FIG. 5B and FIG. 6B, a photoresist layer (not shown) is formed on the second passivation layer by applying photoresist and is patterned in a fourth mask process, thereby forming a photoresist pattern 81 that exposes the first passivation layer 40 corresponding to the second hole hl2.

Then, a common contact hole 55 exposing the common line 7 is formed by removing the first passivation layer 40 and the gate insulating layer 10 corresponding to the second hole hl2.

Next, in FIG. 4C, FIG. 5C and FIG. 6C, the photoresist pattern 81 of FIG. 4B, FIG. 5B and FIG. 6B on the first passivation layer 40 in the pad area PA and the second passivation layer 50 is removed to there expose the first passivation layer 40 in the pad area PA and the second passivation layer 50.

In the array substrate according to the related art, the second passivation layer 50 is substantially formed through 2 mask processes.

Next, referring to FIG. 1, FIG. 2 and FIG. 3, a common electrode 60 is formed on the second passivation layer 50 in a fifth mask process and is connected to the common line 7 through a common contact hole 55. The common electrode 60 includes a first opening op1.

A third passivation layer 65 is formed on the common electrode 60, and the third passivation layer 65 and the first passivation layer 40 corresponding to the first hole hl1 of FIG. 4C are removed in a sixth mask process to thereby form a drain contact hole 68 exposing the drain electrode 36.

Next, a pixel electrode 70 is formed on the third passivation layer 65 in the pixel region P in a seventh mask process and is connected to the drain electrode 36 through the drain contact hole 68. The pixel electrode 70 includes second openings op2 each having a bar shape and spaced apart from each other.

Therefore, the array substrate of the related art is completed by performing seven mask processes. By the way, since each mask process includes several steps of deposition, light-exposure, development, etch, and so on, the more mask processes are performed, the lower productivity decreases and the more manufacturing costs increase.

SUMMARY

An array substrate for a fringe field switching mode liquid crystal display device includes a substrate including a display area and a non-display area; a gate line and a gate pad electrode on the substrate, the gate line extending along a first direction in the display area, the gate pad electrode disposing in the non-display area; a common line on the substrate and parallel to the gate line; a data line extending along a second direction in the display area and a data pad electrode disposing in the non-display area, the data line crossing the gate line to define a pixel region; a thin film transistor electrically connected to the gate and data lines; a first passivation layer covering the thin film transistor and the data line; a second passivation layer on the first passivation layer and having a flat top surface, the second passivation layer having a first thickness in the display area and a second thickness in the non-display area, the first thickness being smaller than the first thickness; a common electrode on the second passivation layer, the common electrode having a first opening corresponding to the thin film transistor and connected to the common line through a common contact hole; a third passivation layer on the common electrode; and a pixel electrode, a gate auxiliary pad electrode and a data auxiliary pad electrode on the third passivation layer, the pixel electrode connected to the drain electrode and including second openings of a bar shape in the pixel region, the gate auxiliary pad electrode connected to the gate pad electrode, the data auxiliary pad electrode connected to the data pad electrode.

In another aspect, a method of manufacturing an array substrate for a fringe field switching mode liquid crystal display device includes forming a gate line, a gate pad electrode and a common line on a substrate including a display area and a non-display area, the gate line and the common line spaced apart from each other and extending along a first direction in the display area, the gate pad electrode connected to the gate line and disposing in the non-display area; forming a gate insulating layer on the gate line, the gate pad electrode and the common line; forming a data line and a data pad electrode on the gate insulating layer, the data line extending along a second direction in the display area and crossing the gate line to define a pixel region, the data pad electrode connected to the data line and disposing in the non-display area; forming a thin film transistor electrically connected to the gate and data lines; forming a first passivation layer over the thin film transistor, the data line and the data pad electrode; forming a second passivation layer on the first passivation layer and having a flat top surface, the second passivation layer including a common contact hole exposing the common line and first, second and third contact holes exposing a drain electrode of the thin film transistor, the gate pad electrode and the data pad electrode, respectively, the second passivation layer having a first thickness in the display area and a second thickness in the non-display area, the first thickness being smaller than the first thickness; forming a common electrode on the second passivation layer, the common electrode having a first opening corresponding to the thin film transistor and connected to the common line through the common contact hole; forming a third passivation layer on the common electrode, the third passivation layer including a drain contact hole exposing the drain electrode, a gate pad contact hole exposing the gate pad electrode and a data pad contact hole exposing the data pad electrode corresponding to the first, second and third contact holes, respectively; and forming a pixel electrode, a gate auxiliary pad electrode and a data auxiliary pad electrode on the third passivation layer, the pixel electrode connected to the drain electrode through the drain contact hole and including second openings of a bar shape in the pixel region, the gate auxiliary pad electrode connected to the gate pad electrode through the gate pad contact hole, the data auxiliary pad electrode connected to the data pad electrode through the data pad contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF EXEMPLARY EMBODIMENTS

Reference will now be made in detail to an exemplary embodiment of the invention, which is illustrated in the accompanying drawings.

Figure 1:
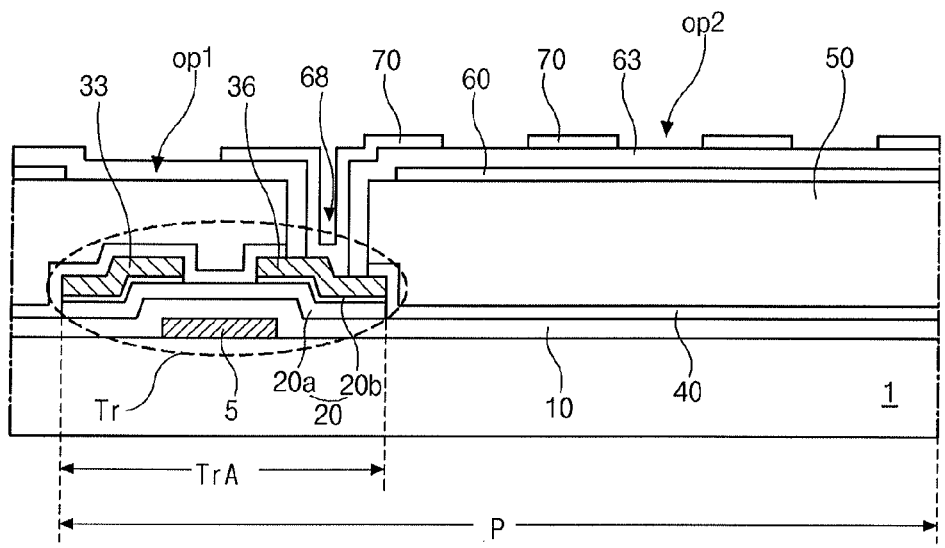
FIG. 1 is a cross-sectional view of illustrating a pixel region of an array substrate for a related art FFS mode LCD device.
Figure 2:
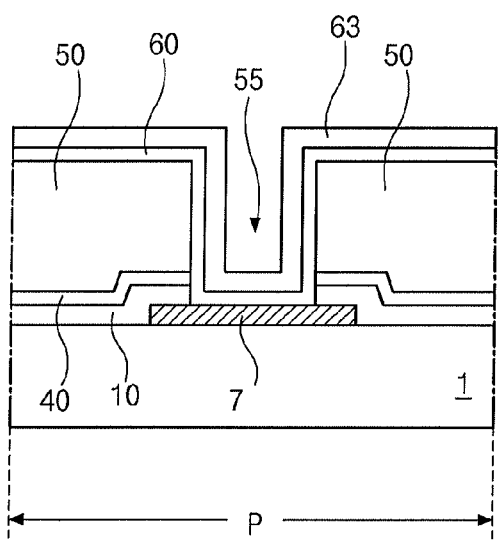
FIG. 2 is a cross-sectional view of illustrating a region for a common contact hole of the array substrate of the related art.
Figure 3:
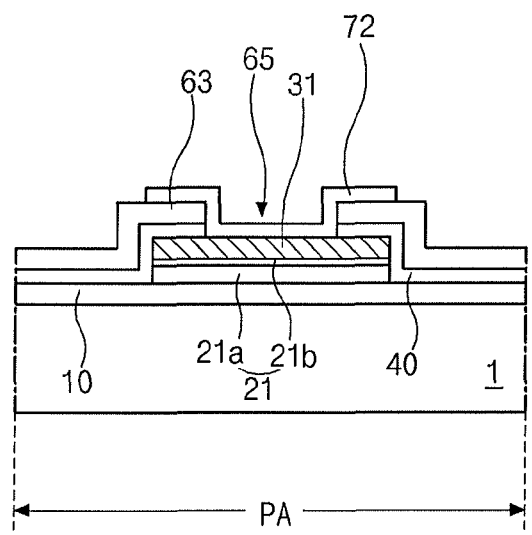
FIG. 3 is a cross-sectional view of illustrating a pad area for a data pad electrode of the array substrate of the related art.
Figure 4A:
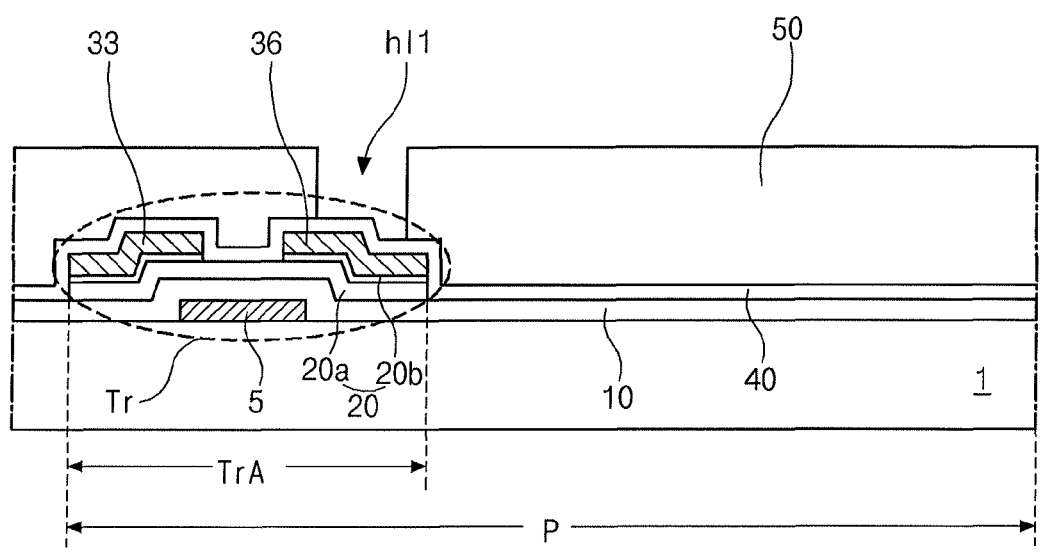
FIGS. 4A to 4C are cross-sectional views of illustrating a pixel region of an array substrate for a related art FFS mode LCD device in steps of manufacturing the same.
Figure 4B:
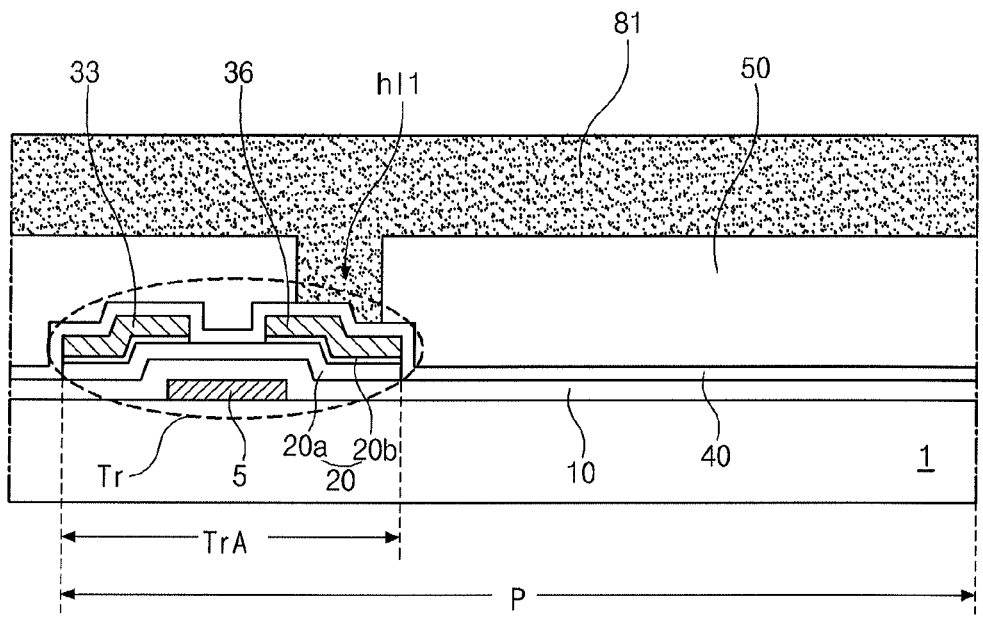
Figure 4C:
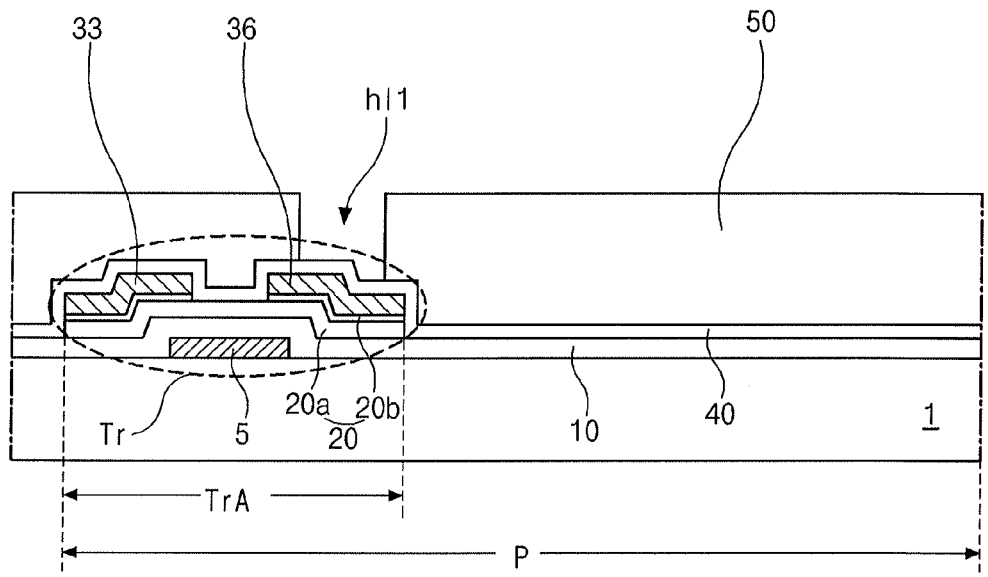
Figure 5A:
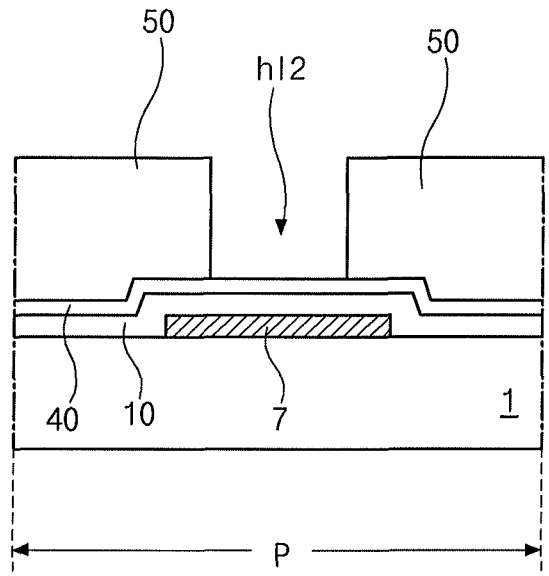
FIGS. 5A to 5C are cross-sectional views of illustrating a region for a common contact hole of the array substrate in steps of manufacturing the same.
Figure 5B:
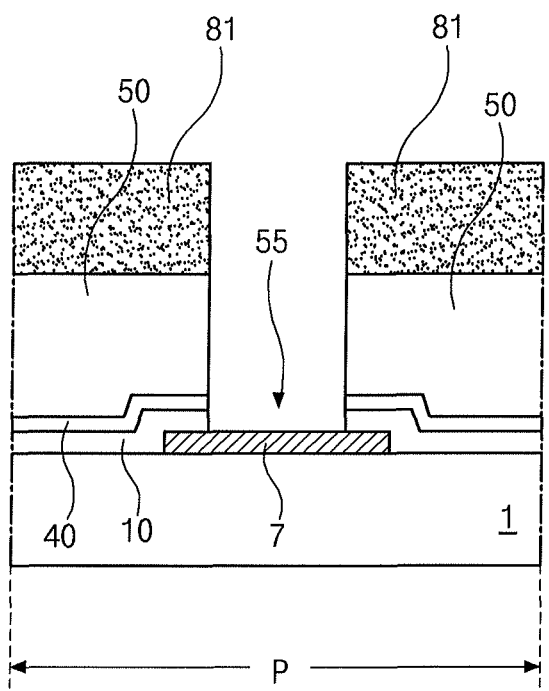
Figure 5C:
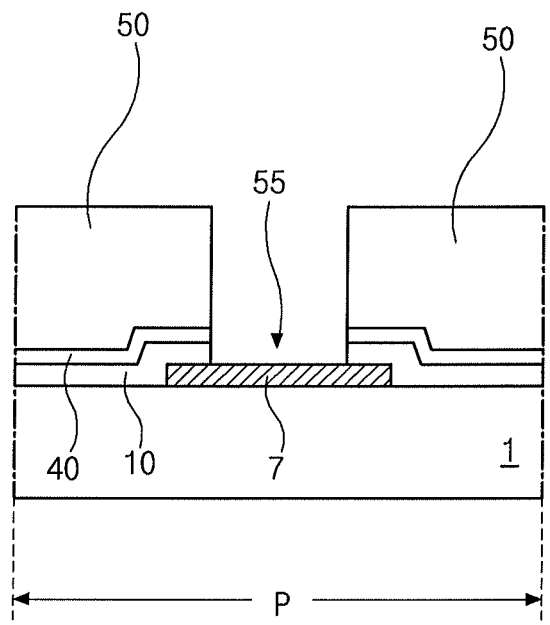
Figure 6A:
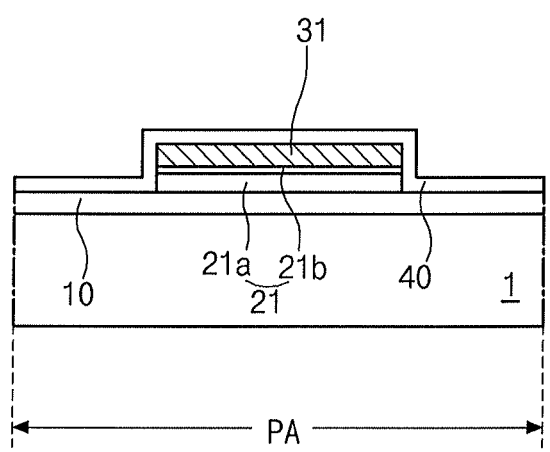
FIGS. 6A to 6C are cross-sectional views of illustrating a pad area for a data pad electrode of the array substrate in steps of manufacturing the same.
Figure 6B:
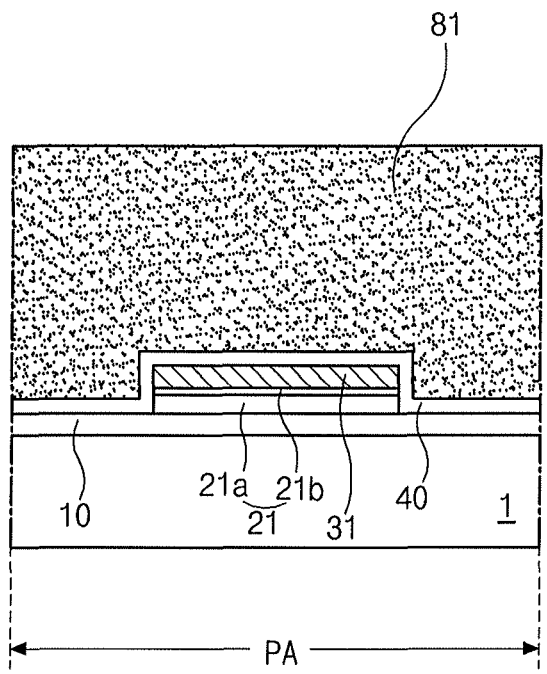
Figure 6C:
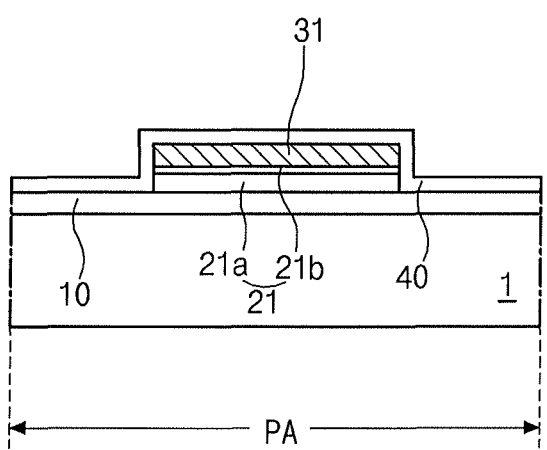
Figure 7:
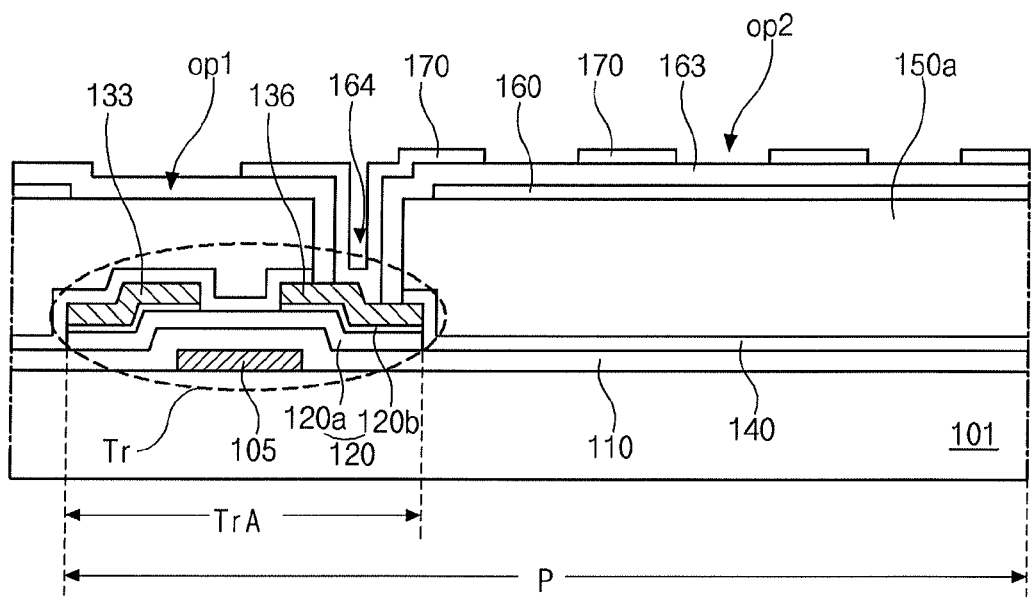
FIG. 7 is a cross-sectional view of illustrating a pixel region of an array substrate for an FFS mode LCD device according to an exemplary embodiment of the invention.
Figure 8:
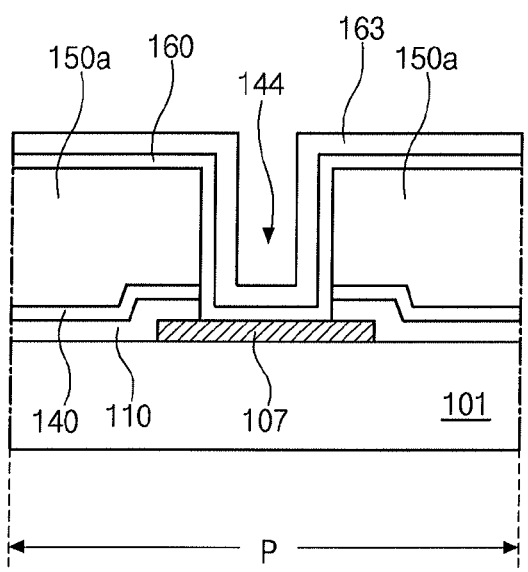
FIG. 8 is a cross-sectional view of illustrating a region for a common contact hole of the array substrate according to the exemplary embodiment of the invention.
Figure 9:
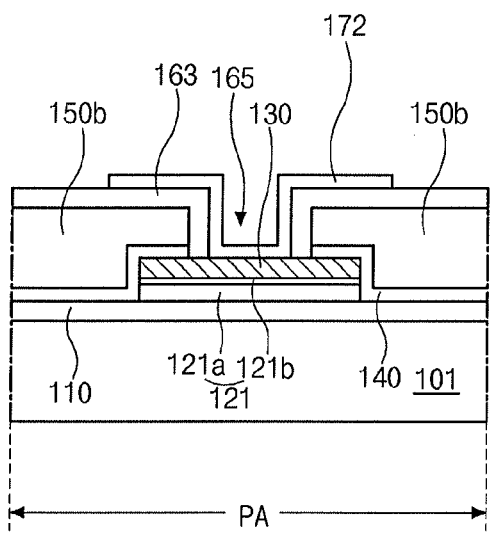
FIG. 9 is a cross-sectional view of illustrating a pad area for a data pad electrode of the array substrate according to the exemplary embodiment of the invention.

FIG. 7 is a cross-sectional view of illustrating a pixel region of an array substrate for an FFS mode LCD device according to an exemplary embodiment of the invention, FIG. 8 is a cross-sectional view of illustrating a region for a common contact hole of the array substrate according to the exemplary embodiment of the invention, and FIG. 9 is a cross-sectional view of illustrating a pad area for a data pad electrode of the array substrate according to the exemplary embodiment of the invention. For convenience of the explanation, a switching area TrA in which a thin film transistor Tr is formed is defined in a pixel region P.

In FIG. 7, FIG. 8 and FIG. 9, a gate line (not shown), a gate pad electrode (not shown), a gate electrode 105 and a common line 107 are formed on a transparent insulating substrate 101. The gate line extends along a first direction, and the gate pad electrode is connected to one end of the gate line. The gate electrode 105 is disposed in the switching area TrA and is connected to the gate line. The common line 107 is parallel to the gate line. The gate line, the gate electrode 105 and the common line 107 are disposed in a display area where an image is displayed. The gate pad electrode is disposed in a gate pad area of a non-display area surrounding the display area.

The gate line, the gate pad electrode, the gate electrode 105 and the common line 107 are formed of a metallic material having relatively low resistivity. The metallic material may be one or more selected from aluminum (Al), aluminum alloy including aluminum neodymium (AlNd), copper (Cu), copper alloy, molybdenum (Mo) or molybdenum alloy including molybdenum titanium (MoTi).

A gate insulating layer 110 is formed on the gate line, the gate pad electrode, the gate electrode 105, and the common line 107.

In the switching area TrA, a semiconductor layer 120 is formed over the gate insulating layer 110 corresponding to the gate electrode 105. The semiconductor layer 120 includes an active layer 120a of intrinsic amorphous silicon and ohmic contact layers 120b of impurity-doped amorphous silicon. The ohmic contact layers 120b are spaced apart from each other over the gate electrode 105.

Source and drain electrodes 133 and 136 are formed over the semiconductor layer 120 and are spaced apart from each other. A data line (not shown) is formed over the gate insulating layer 110 along a second direction. The data line crosses the gate line to define the pixel region P and also crosses the common line 107. The data line is connected to the source electrode 133. A data pad electrode 130 is formed over the gate insulating layer 110 in a pad area PA and is connected to one end of the data line. A semiconductor dummy pattern 121 including a first pattern 121a and a second pattern 121b is formed under the data pad electrode 130 and the data line.

The gate electrode 105, the semiconductor layer 120, the source electrode 133 and the drain electrode 136 sequentially disposed in the switching area TrA constitute a thin film transistor Tr, which is a switching element.

A first passivation layer 140 of an inorganic insulating material such as silicon oxide (SiO2) or silicon nitride (SiNx) is formed on the data line, the data pad electrode 130, and the source and drain electrodes 133 and 136 all over the substrate 101. A second passivation layer 150a and 150b of an organic insulating material such as photo acryl is formed on the first passivation layer 140 and has a flat top surface. The second passivation layer 150a in the pixel region P of the display area has a first thickness and the second passivation layer 150b in the pad area PA of the non-display area has a second thickness smaller than the first thickness. As not shown in the figures, the second passivation layer in the gate pad area also has a second thickness. The second thickness, beneficially, is less than a half of the first thickness.

Meanwhile, a common contact hole 144 is formed in the gate insulating layer 110, the first passivation layer 140 and the second passivation layer 150a in the pixel region P and exposes the common line 107. Each common contact hole 144 may correspond to each pixel region P, or each common contact hole 144 may correspond to each group including a plurality of pixel regions P arranged in the first direction.

A common electrode 160 is formed on the second passivation layer 150a and disposed substantially all over the display area. The common electrode 160 is formed of a transparent conductive material such as indium-tin-oxide (ITO) or indium-zinc-oxide (IZO). The common electrode 160 is connected to the common line 107 through the common contact hole 144. The common electrode 160 has a first opening op1 exposing the second passivation layer 150 in the switching area TrA.

A third passivation layer 163 of an inorganic insulating material such as silicon oxide (SiO2) or silicon nitride (SiNx) is formed on the common electrode 160 having the first opening op1 and the second passivation layer 150a and 150b. A drain contact hole 164 exposing the drain electrode 136 of the thin film transistor Tr is formed in the third passivation layer 163, the second passivation layer 150a and the first passivation layer 140 in the switching area TrA. A data pad contact hole 165 exposing the data pad electrode 130 is formed in the third passivation layer 163, the second passivation layer 150b and the first passivation layer 140 in the pad area PA. Although not shown in the figures, a gate pad contact hole exposing the gate pad electrode is formed in the third passivation layer 163, the second passivation layer 150b, the first passivation layer 140, and the gate insulating layer 110 in the gate pad area.

A pixel electrode 170 of a transparent conductive material such as indium tin oxide (ITO) or indium zinc oxide (IZO) is formed on the third passivation layer 163 in each pixel region P and is connected to the drain electrode 136 through the drain contact hole 164. The pixel electrode 170 includes a plurality of second openings op2, which each have a bar shape and are spaced apart from each other. The second openings op2 in each pixel region P may be bent symmetrically with respect to a central portion of the pixel region P, or the second openings op2 in adjacent pixel regions P along the second direction may be bent symmetrically with respect to the gate line.

In addition, a data auxiliary pad electrode 172 is formed on the third passivation layer 163 in the pad area PA and is connected to the data pad electrode 130 through the data pad contact hole 165. Although not shown in the figures, a gate auxiliary pad electrode is also formed on the third passivation layer 163 in the gate pad area and is connected to the gate pad electrode through the gate pad contact hole.

The array substrate according to the embodiment of the invention is formed by six mask processes. One mask process is reduced as compared with the related art array substrate. Thus, productivity is increased, and manufacturing costs are decreased.

Moreover, since the second passivation layer 150b in the pad area PA of the non-display area has the second thickness smaller than the first thickness of the passivation layer 150a in the pixel region P of the display area, a step height between the display area and the pad area PA is lowered in comparison to the related art array substrate, and it is prevented to cause problems in the related art array substrate such as poor electrical connection between the conductive balls and the printed circuit board due to a large diameter of the pad contact holes or a large depth of the pad contact holes.

A method of manufacturing an array substrate for an FFS mode LCD device according to the invention will be explained hereinafter with reference to drawings.

FIGS. 10A to 10H are cross-sectional views of illustrating a pixel region of an array substrate for an FFS mode LCD device according to an exemplary embodiment of the invention in steps of manufacturing the same, FIGS. 11A to 11H are cross-sectional views of illustrating a region for a common contact hole of the array substrate according to the exemplary embodiment of the invention in steps of manufacturing the same, and FIGS. 12A to 12H are cross-sectional views of illustrating a pad area for a data pad electrode of the array substrate according to the exemplary embodiment of the invention in steps of manufacturing the same. For convenience of the explanation, a switching area TrA in which a thin film transistor Tr is formed is defined in a pixel region P.

Figure 10A:
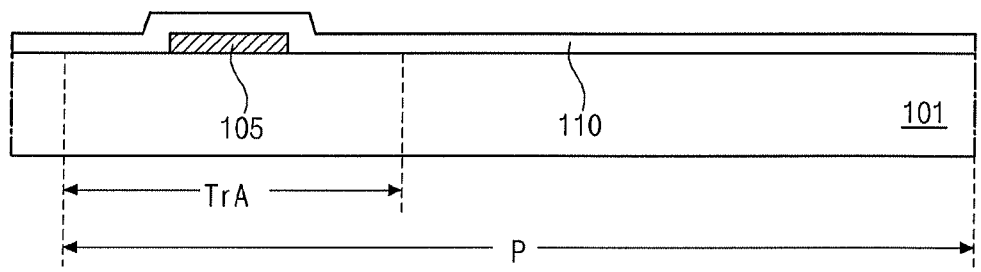
FIGS. 10A to 10H are cross-sectional views of illustrating a pixel region of an array substrate for an FFS mode LCD device according to an exemplary embodiment of the invention in steps of manufacturing the same.
Figure 11A:
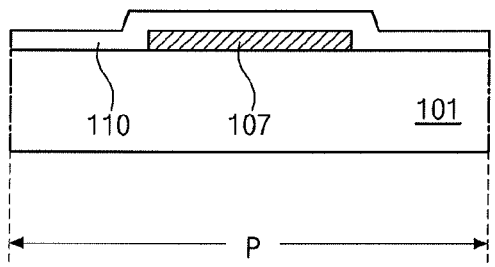
FIGS. 11A to 11H are cross-sectional views of illustrating a region for a common contact hole of the array substrate according to the exemplary embodiment of the invention in steps of manufacturing the same.
Figure 12A:
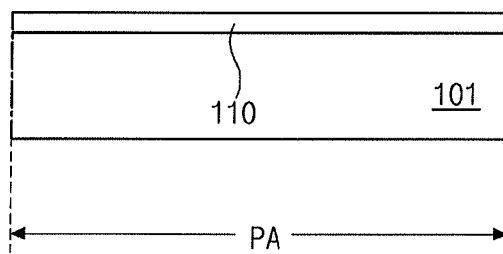
FIGS. 12A to 12H are cross-sectional views of illustrating a pad area for a data pad electrode of the array substrate according to the exemplary embodiment of the invention in steps of manufacturing the same.

In FIG. 10A, FIG. 11A, and FIG. 12A, a first metallic layer (not shown) is formed on a transparent insulating substrate 101 by depositing a metallic material having relatively low resistivity and is patterned in a mask process including steps of applying photoresist, light-exposing the photoresist through a photo mask, developing the photoresist exposed to light, etching a thin film and stripping the photoresist, thereby forming a gate line (not shown), a gate pad electrode (not shown), a gate electrode 105 and a common line 107. The metallic material may be one or more selected from aluminum (Al), aluminum alloy including aluminum neodymium (AlNd), copper (Cu), copper alloy, molybdenum (Mo) or molybdenum alloy including molybdenum titanium (MoTi).

The gate line extends along a first direction, and the gate pad electrode is connected to one end of the gate line. The gate electrode 105 is disposed in the switching area TrA and is connected to the gate line. The common line 107 is parallel to the gate line. The gate line, the gate electrode 105 and the common line 107 are disposed in a display area where an image is displayed. The gate pad electrode is disposed in a gate pad area of a non-display area surrounding the display area.

Then, a gate insulating layer 110 is formed on the gate line, the gate pad electrode, the gate electrode 105, and the common line 107 by depositing an inorganic insulating material all over the substrate 101. The inorganic insulating material includes silicon oxide ($SiO_2$) or silicon nitride (SiNx).

Figure 10B:
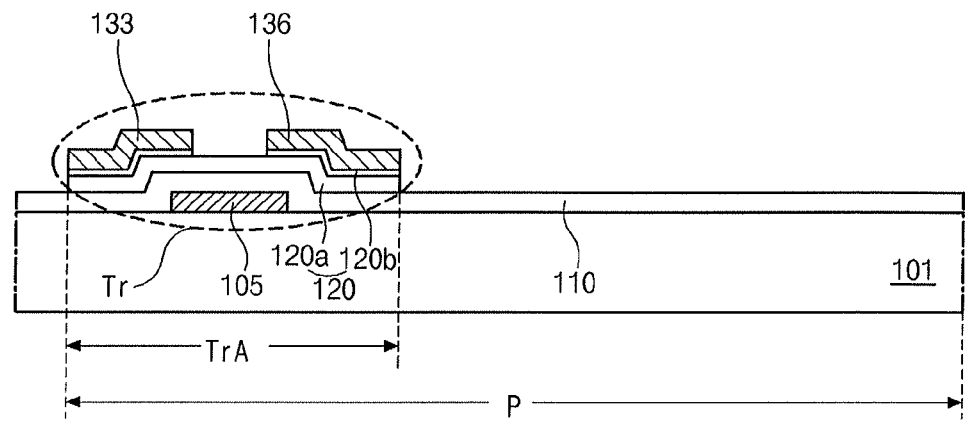
Figure 11B:
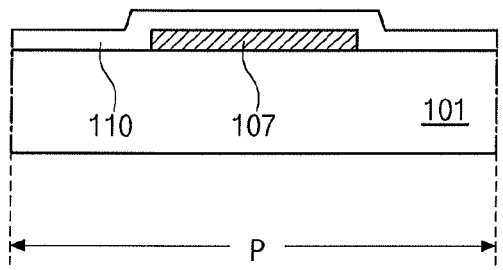
Figure 12B:
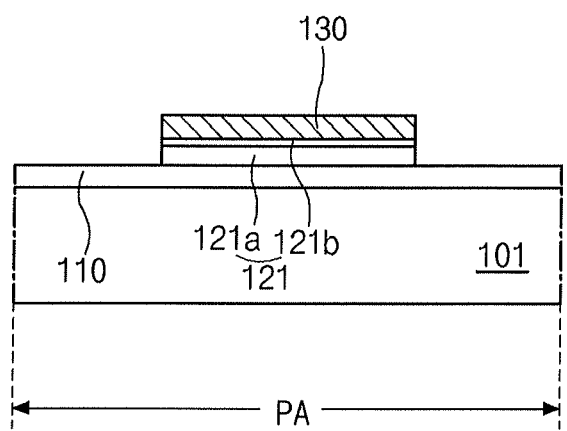

Next, in FIG. 10B, FIG. 11B and FIG. 12B, an intrinsic amorphous silicon layer (not shown), an impurity-doped amorphous silicon layer (not shown) and a second metallic layer (not show) are sequentially formed on the gate insulating layer 110 and are patterned in one mask process including half-tone type light-exposure or diffraction-type light-exposure, thereby forming a semiconductor layer 120 and source and drain electrodes 133 and 136 over the semiconductor layer 120 corresponding to the gate electrode 105 in the switching area TrA of the pixel region P. The semiconductor layer 120 includes an active layer 120a of intrinsic amorphous silicon and ohmic contact layers 120b of impurity-doped amorphous silicon. The ohmic contact layers 120b are spaced apart from each other. The source and drain electrodes 133 and 136 are disposed on the ohmic contact layers 120b and spaced apart from each other.

The gate electrode 105, the gate insulating layer 110, the semiconductor layer 120 including the active layer 120a and the ohmic contact layers 120b, and the source and drain electrodes 133 and 136 sequentially layered in the switching area TrA constitute a thin film transistor Tr, which functions as a switching element.

Meanwhile, simultaneously, a data line (not shown) and a data pad electrode 130 are formed on the gate insulating layer 110. The data line extends along a second direction and crosses the gate line and the common line 107. The data line and the gate line define the pixel region P. The data pad electrode 130 is connected to one end of the data line and disposed in a pad area PA of the non-display area.

At this time, a semiconductor dummy pattern 121 is formed under the data line and the data pad electrode 130. The semiconductor dummy pattern 121 includes a first pattern 121a of intrinsic amorphous silicon, which is the same material as the active layer 120a, and a second pattern 121b of impurity-doped amorphous silicon, which is the same material as the ohmic contact layers 120b.

Figure 10C:
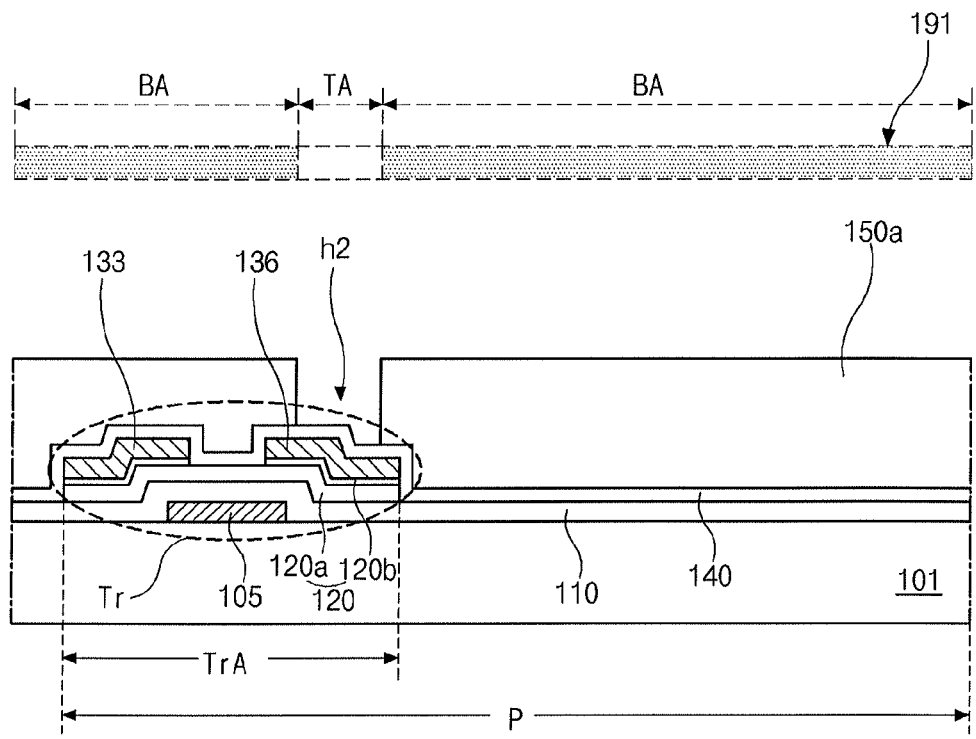
Figure 11C:
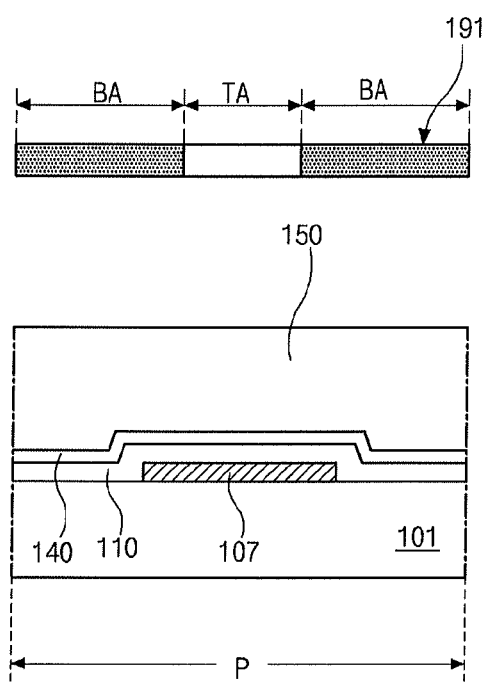
Figure 12C:
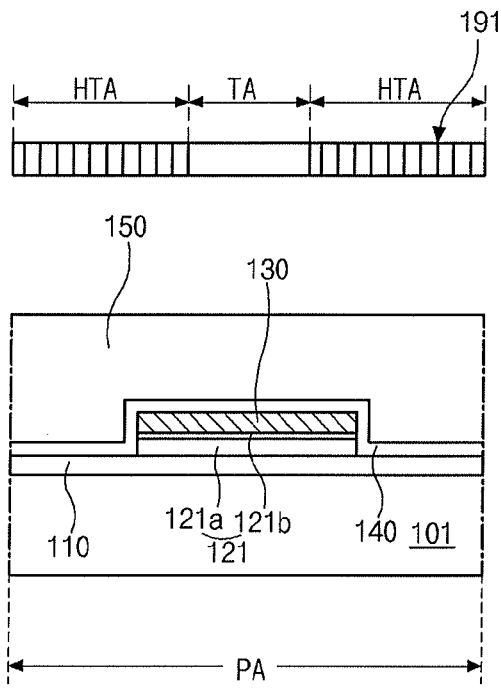

Next, in FIG. 10C, FIG. 11C, and FIG. 12C, a first passivation layer 140 is formed on the data line, the data pad electrode 130, the source electrode 133 and the drain electrode 136 by depositing an inorganic insulating material such as silicon oxide ($SiO_2$) or silicon nitride (SiNx) over an entire surface of the substrate 101.

Then, an organic insulating material layer 150 is formed on the first passivation layer 140 by applying an organic insulating material having relatively low dielectric constant such as photo acryl over an entire surface of the substrate 101. The organic insulating material layer 150 has a thickness of about 1 micrometer to 3 micrometers and has a flat top surface.

The first passivation layer 140 prevents the active layer 120a exposed between the source and drain electrodes 133 and 136 from being contaminated by directly contact with the organic insulating material layer 150 of photo acryl. The first passivation layer 140 also prevents poor contact between the drain electrode 136 and a pixel electrode, which will be formed later, due to contamination of the drain electrode 136 when the organic insulating material layer 150 is patterned.

Next, a diffraction-type or half-tone type photo mask 191 is disposed over the organic insulating material layer 150, and the organic insulating material layer 150 is exposed to light through the photo mask 191 by irradiating UV light over the photo mask 191.

The photo mask 191 includes a light-transmitting portion (TA), a light-blocking portion (BA), and a half-light transmitting portion (HTA). The light-transmitting portion TA corresponds to the common line 107, the drain electrode 136, the gate pad electrode (not shown), and the data pad electrode 130. The half-light transmitting portion HTA corresponds to the gate pad area (not shown) and the pad area PA excluding the gate pad electrode and the data pad electrode 130. The light-blocking portion BA corresponds to other regions.

Here, the organic insulating material layer 150 has a photosensitive property and is a positive type that a portion exposed to light is removed after developing. However, the organic insulating material layer 150 may be a negative type that a portion exposed to light remains after developing, and in this case, the same result can be obtained by changing positions of the light-blocking portion BA and the light-transmitting portion TA of the photo mask 191.

Figure 10D:
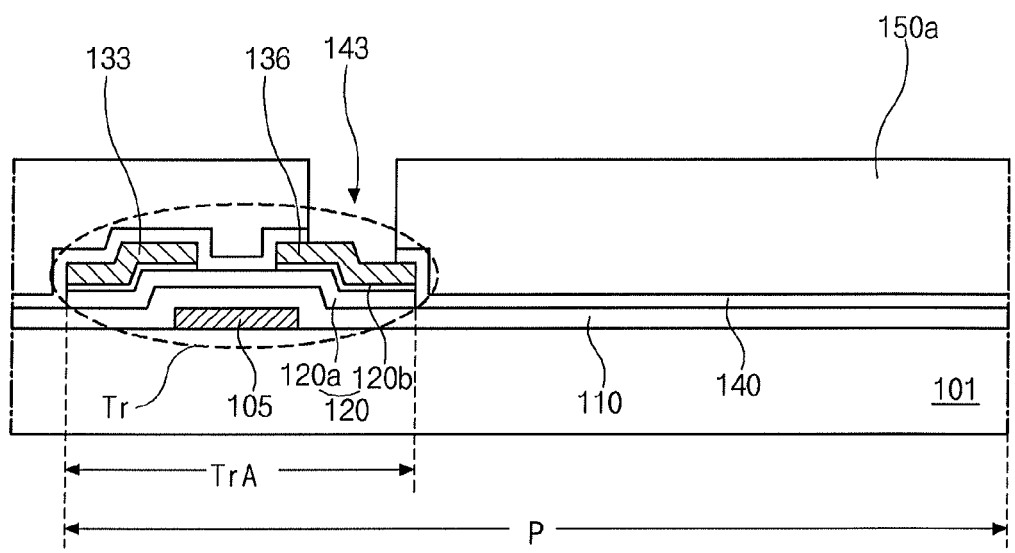
Figure 11D:
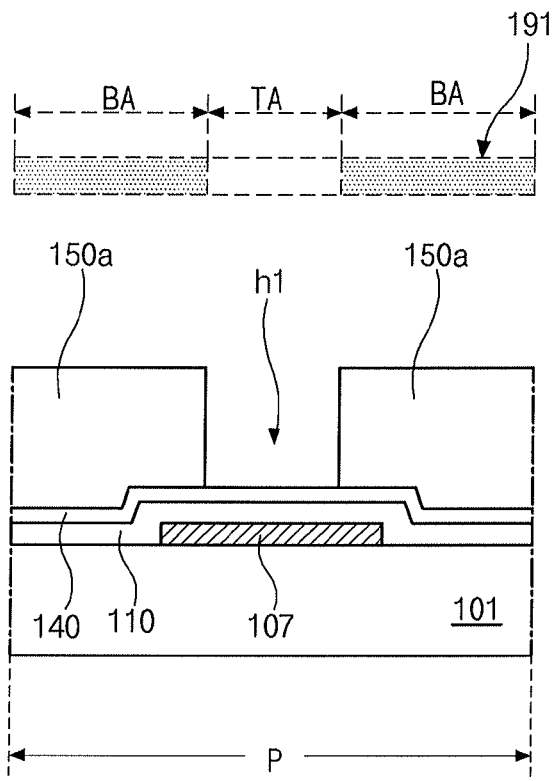
Figure 12D:
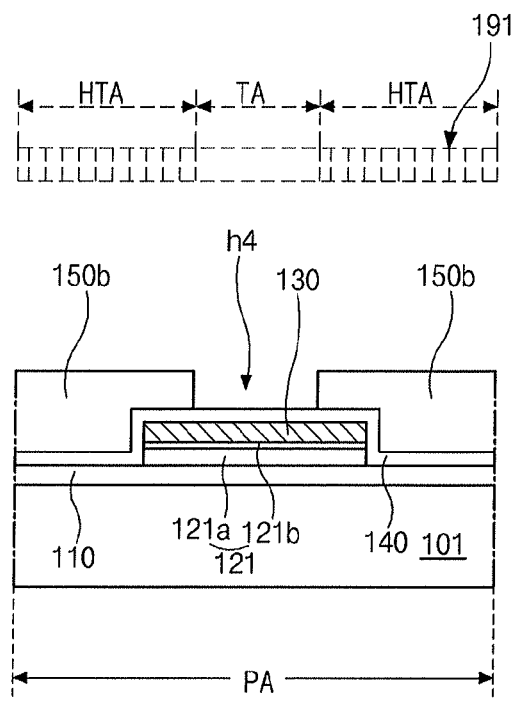

Next, in FIG. 10D, FIG. 11D and FIG. 12D, a second passivation layer 150a and 150b is formed on the first passivation layer 140 by developing the organic insulating material layer 150 of FIG. 10C, FIG. 11C and FIG. 12C exposed to light. The second passivation layer 150a in the display area including the pixel region P has a first thickness, and the second passivation layer 150b in the non-display area including the pad area PA and the gate pad area (not shown) has a second thickness smaller than the first thickness.

In addition, a first hole h1 a second hole h2, a third hole (not shown), and a fourth hole h4 exposing the first passivation layer 140 are formed in the second passivation layer 150a and 150b. The first hole h1 corresponds to the common line 107, the second hole h2 corresponds to the drain electrode 136, the third hole (not shown) corresponds to the gate pad electrode (not shown), and the fourth hole h4 corresponds to the data pad electrode 130.

Figure 10E:
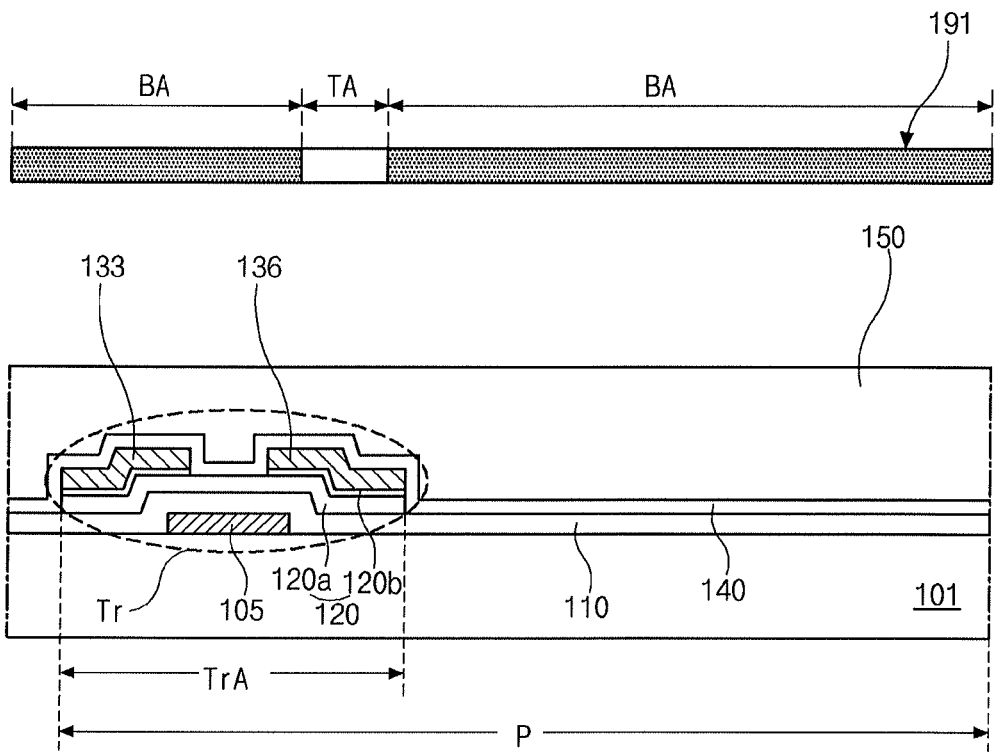
Figure 11E:
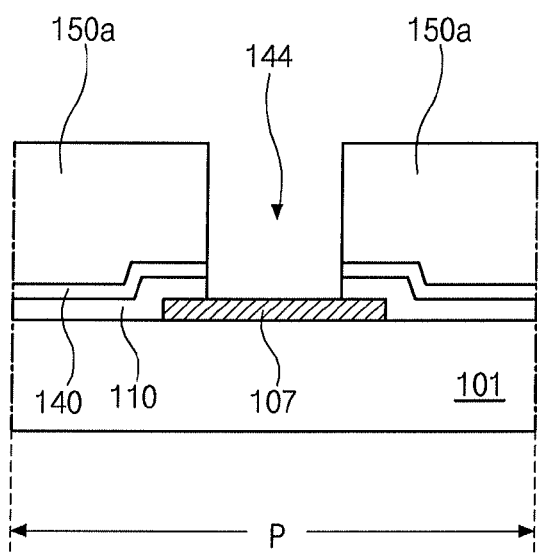
Figure 12E:
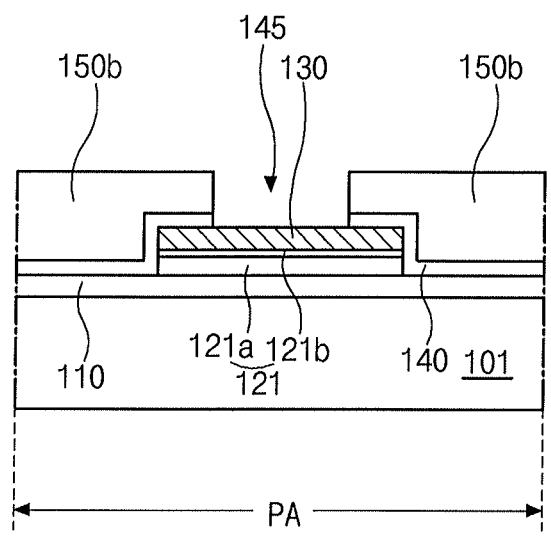

Next, in FIG. 10E, FIG. 11E and FIG. 12E, dry-etching or wet-etching is performed to the substrate 101 including the second passivation layer 150a and 150b having the first and second thicknesses and the first, second, third and fourth holes h1, h2, and h4 of FIG. 10D, FIG. 11D and FIG. 12D to thereby remove the first passivation layer 140 and/or the gate insulating layer 110. More particularly, the first passivation layer 140 corresponding to the second hole h2 of FIG. 10D is removed to form an auxiliary drain contact hole 143 exposing the drain electrode 136 in the first passivation layer 140 and the second passivation layer 150a. The first passivation layer 140 and the gate insulating layer 110 corresponding to the first hole h1 of FIG. 11D and the third hole (not shown) are removed to form a common contact hole 144 exposing the common line 107 and an auxiliary gate pad contact hole (not shown) exposing the gate pad electrode (not shown) in the gate insulating layer 110, the first passivation layer 140 and the second passivation layer 150a. The first passivation layer 140 corresponding to the fourth hole h4 of FIG. 12D is removed to form an auxiliary data pad contact hole 145 exposing the data pad electrode 130 in the first passivation layer 140 and the second passivation layer 150b.

Figure 10F:
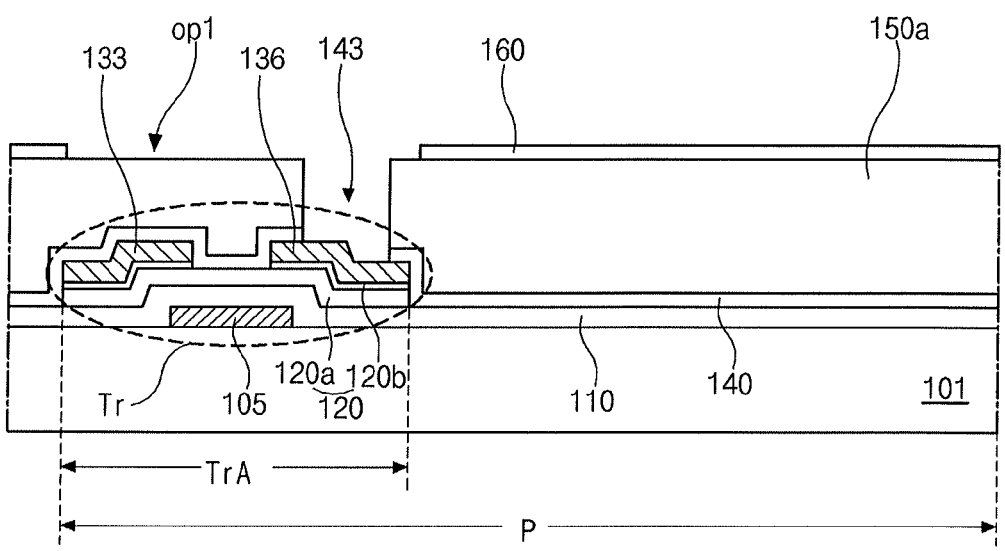
Figure 11F:
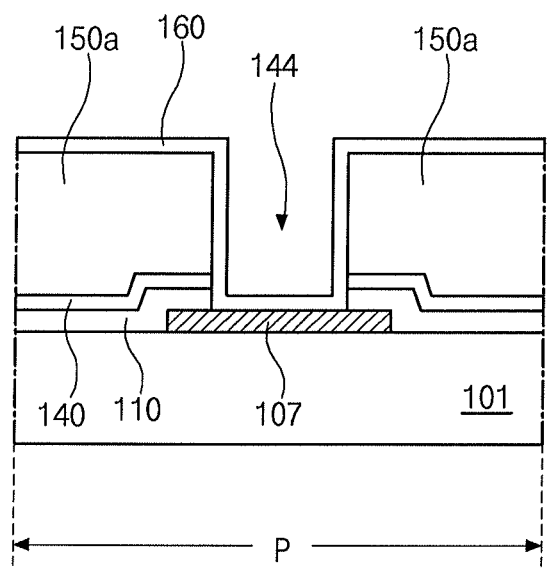
Figure 12F:
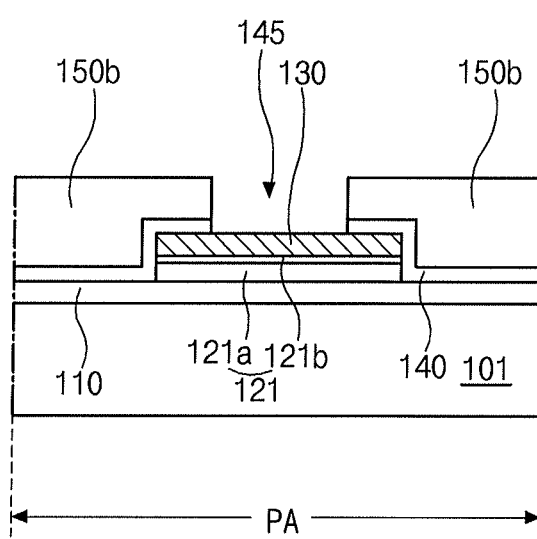

Next, in FIG. 10F, FIG. 11F and FIG. 12F, a first transparent conductive material layer (not shown) is formed on the second passivation layer 150a and 150b including the auxiliary drain contact hole 143, the common contact hole 144, the auxiliary gate pad contact hole (not shown) and the auxiliary data pad contact hole 145 by depositing a transparent conductive material over an entire surface of the substrate 101. The transparent conductive material may be indium tin oxide (ITO) or indium zinc oxide (IZO). The first transparent conductive material layer is patterned in a mask process to thereby form a common electrode 160 all over the display area. The common electrode 160 has a first opening op1 in the switching area TrA. The common electrode 160 contacts the common line 107 through the common contact hole 144.

Since the common electrode 160 has the first opening op1 in the switching area TrA, the drain electrode 136 is still exposed by the auxiliary drain contact hole 143. The gate pad electrode (not shown) and the data pad electrode 131 are exposed by the auxiliary gate pad contact hole (not shown) and the auxiliary data pad contact hole 145, respectively, because the common electrode 160 is not formed in the gate pad area (not shown) and the pad area PA of the non-display area.

Figure 10G:
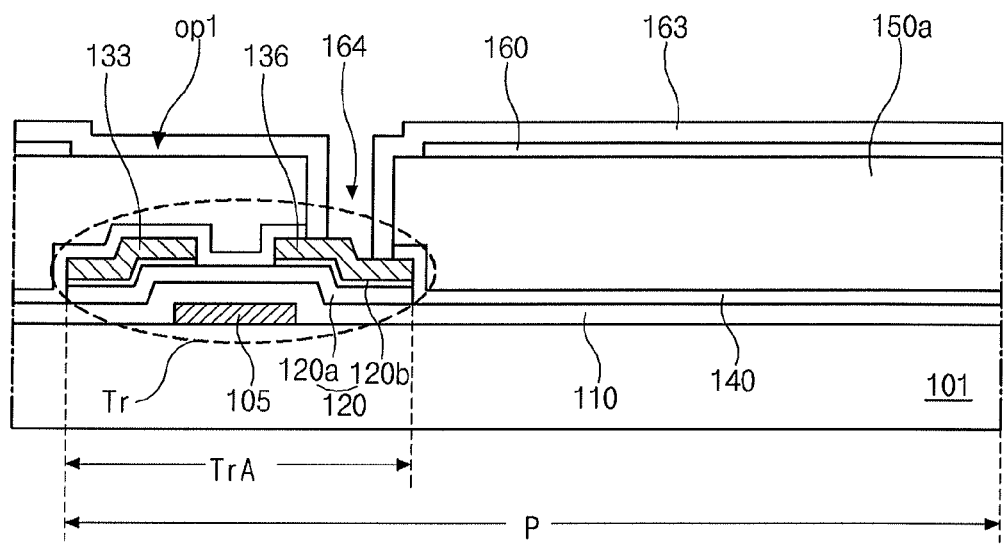
Figure 11G:
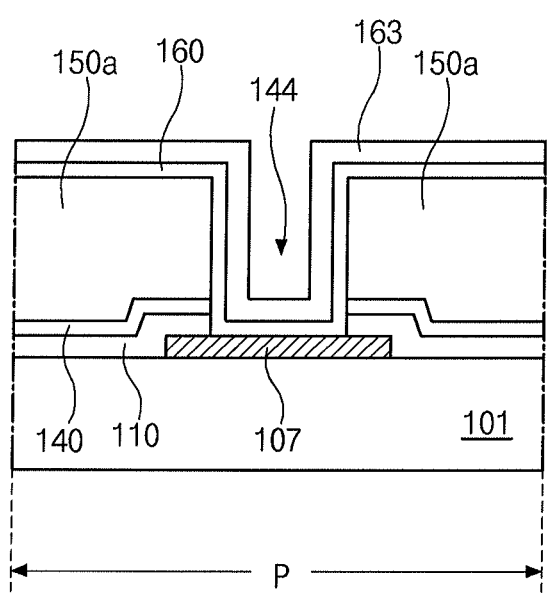
Figure 12G:
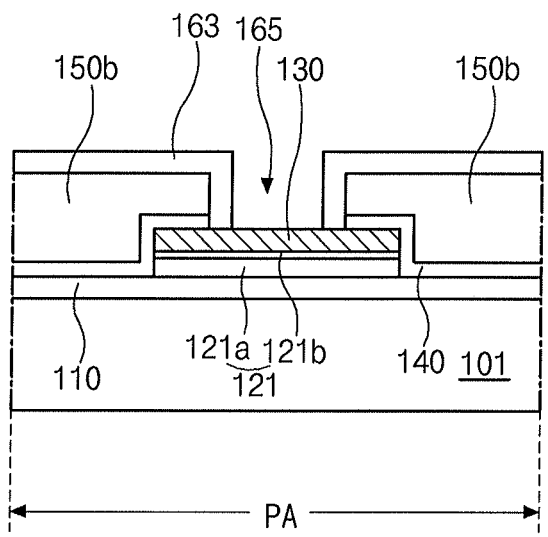

In FIG. 10G, FIG. 11G and FIG. 12G, a third passivation layer 163 is formed on the common electrode 160 having the first opening op1 by depositing an inorganic insulating material such as silicon oxide ($SiO_2$) or silicon nitride (SiNx) over an entire surface of the substrate 101. Then, the third passivation layer 163 is patterned in a mask process, thereby forming a drain contact hole 164, a gate pad contact hole (not shown) and a data pad contact hole 165. The drain contact hole 164 passes through the auxiliary drain contact hole 143 of FIG. 10F in the switching area TrA and exposes the drain electrode 136. The gate pad contact hole (not shown) passes through the auxiliary gate pad contact hole (not shown) and exposes the gate pad electrode (not shown). The data pad contact hole 165 passes through the auxiliary data pad contact hole 145 of FIG. 12 and exposes the data pad electrode 130.

Figure 10H:
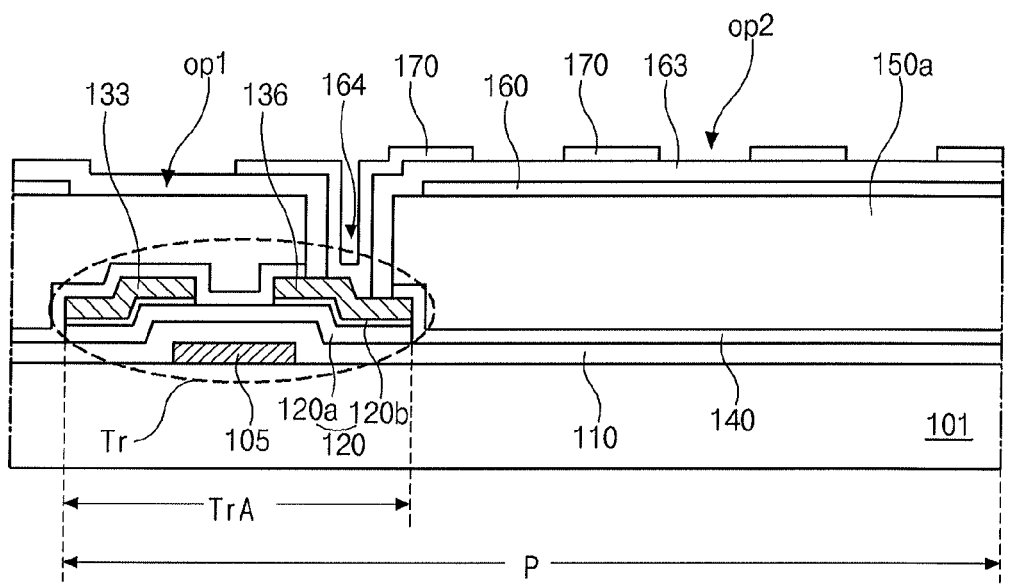
Figure 11H:
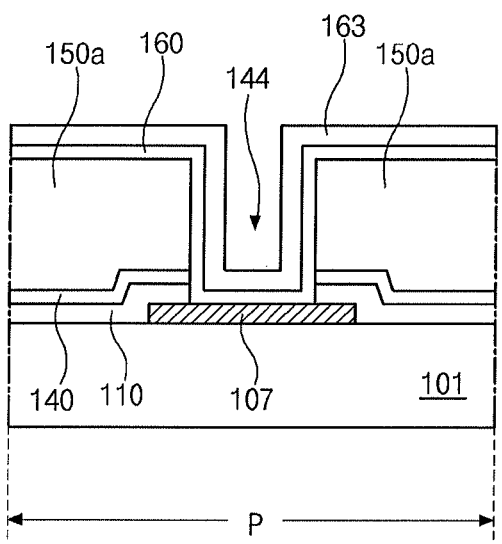
Figure 12H:
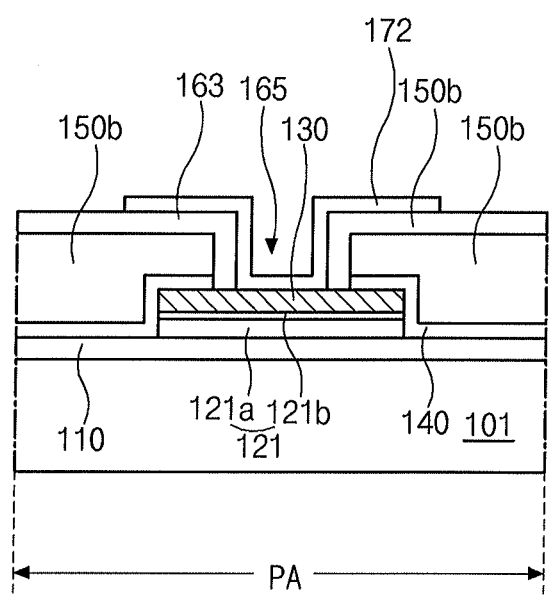

Next, in FIG. 10H, FIG. 11H and FIG. 12H, a second transparent conductive material layer (not shown) is formed on the third passivation layer 163 including the drain contact hole 164, the gate pad contact hole (not shown) and the data pad contact hole 165 by depositing a transparent conductive material over an entire surface of the substrate 101. The transparent conductive material may be indium tin oxide (ITO) or indium zinc oxide (IZO). The second transparent conductive material layer is patterned in a mask process to thereby form a pixel electrode 170 in the pixel region P. The pixel electrode 170 has a plate shape in plan view and includes a plurality of second openings op2, which each have a bar shape and spaced apart from each other. The pixel electrode 170 is connected to the drain electrode 136 through the drain contact hole 164.

At the same time, a gate auxiliary pad electrode (not shown) and a data auxiliary pad electrode 172 are formed on the third passivation layer 163 in the gate pad area (not shown) and the pad area PA of the non-display area. The gate auxiliary pad electrode contacts the gate pad electrode (not shown) through the gate pad contact hole (not shown), and the data auxiliary pad electrode 172 contacts the data pad electrode 130 through the data pad contact hole 165.

Therefore, the array substrate for an FFS mode LCD device according to the embodiment of the invention is completed.

Since the array substrate according to the embodiment of the invention is formed by six mask processes, one mask process is reduced as compared with the related art array substrate which is manufactured by seven mask processes. Accordingly, productivity per unit time is increased, and manufacturing costs are decreased.

Moreover, the second passivation layer in the pad area and the gate pad area of the non-display area has a smaller thickness than the passivation layer in the pixel region of the display area. Thus, a step height between the display area and the pad area is lowered in comparison to the related art array substrate, and it is prevented to cause problems in the related art array substrate such as poor electrical connection between the conductive balls and the printed circuit board due to a large diameter of the pad contact holes or a large depth of the pad contact holes.

It will be apparent to those skilled in the art that various modifications and variation can be made in the invention without departing from the spirit or scope of the invention. Thus, it is intended that the invention cover the modifications and variations of this invention provided they come within the scope of the appended claims and their equivalents.

What is claimed is:

1. An array substrate for a fringe field switching mode liquid crystal display device, comprising:
    a substrate including a display area and a non-display area;
    a gate line and a gate pad electrode on the substrate, the gate line extending along a first direction in the display area, the gate pad electrode disposing in the non-display area;
    a common line on the substrate and parallel to the gate line;
    a data line extending along a second direction in the display area and a data pad electrode disposing in the non-display area, the data line crossing the gate line to define a pixel region;
    a thin film transistor electrically connected to the gate and data lines;
    a first passivation layer covering the thin film transistor and the data line;
    a second passivation layer on the first passivation layer and having a flat top surface, the second passivation layer having a first thickness in the display area and a second thickness in the non-display area, the second thickness being smaller than the first thickness;
    a common electrode on the second passivation layer, the common electrode having a first opening corresponding to the thin film transistor and connected to the common line through a common contact hole;
    a third passivation layer on the common electrode; and
    a pixel electrode, a gate auxiliary pad electrode and a data auxiliary pad electrode on the third passivation layer, the pixel electrode connected to the drain electrode and including second bar shaped openings in the pixel region, the gate auxiliary pad electrode connected to the gate pad electrode, the data auxiliary pad electrode connected to the data pad electrode.

2. The array substrate according to claim 1, wherein a drain contact hole exposing the drain electrode and a data pad contact hole exposing the data pad electrode are in the first, second and third passivation layers, and a common contact hole exposing the common line and a gate pad contact hole exposing the gate pad electrode are in the gate insulating layer and the first, second and third passivation layers.

3. The array substrate according to claim 2, wherein the pixel electrode contacts the drain electrode through the drain contact hole, the common electrode contacts the common line through the common contact hole, the gate auxiliary pad electrode contacts the gate pad electrode through the gate pad contact hole, and the data auxiliary pad contact hole contacts the data pad electrode through the data pad contact hole.

4. The array substrate according to claim 1, wherein the gate insulating layer, the first passivation layer and the third passivation layer are of an inorganic insulating material including silicon oxide or silicon nitride, and the second passivation layer is of an organic insulating material including photo acryl.

5. The array substrate according to claim 1, wherein the second thickness is less than a half of the first thickness.

6. A method of manufacturing an array substrate for a fringe field switching mode liquid crystal display device, comprising:
    forming a gate line, a gate pad electrode and a common line on a substrate including a display area and a non-display area, the gate line and the common line spaced apart from each other and extending along a first direction in the display area, the gate pad electrode connected to the gate line and disposing in the non-display area;
    forming a gate insulating layer on the gate line, the gate pad electrode and the common line;
    forming a data line and a data pad electrode on the gate insulating layer, the data line extending along a second direction in the display area and crossing the gate line to define a pixel region, the data pad electrode connected to the data line and disposing in the non-display area;
    forming a thin film transistor electrically connected to the gate and data lines;
    forming a first passivation layer over the thin film transistor, the data line and the data pad electrode;
    forming a second passivation layer on the first passivation layer and having a flat top surface, the second passivation layer including a common contact hole exposing the common line and first, second and third contact holes exposing a drain electrode of the thin film transistor, the gate pad electrode and the data pad electrode, respectively, the second passivation layer having a first thickness in the display area and a second thickness in the non-display area, the second thickness being smaller than the first thickness;
    forming a common electrode on the second passivation layer, the common electrode having a first opening corresponding to the thin film transistor and connected to the common line through the common contact hole;

forming a third passivation layer on the common electrode, the third passivation layer including a drain contact hole exposing the drain electrode, a gate pad contact hole exposing the gate pad electrode and a data pad contact hole exposing the data pad electrode corresponding to the first, second and third contact holes, respectively; and forming a pixel electrode, a gate auxiliary pad electrode and a data auxiliary pad electrode on the third passivation layer, the pixel electrode connected to the drain electrode through the drain contact hole and including second openings of a bar shape in the pixel region, the gate auxiliary pad electrode connected to the gate pad electrode through the gate pad contact hole, the data auxiliary pad electrode connected to the data pad electrode through the data pad contact hole.

7. The method according to claim 6, wherein forming the second passivation includes:

forming an organic insulating material layer on the first passivation layer by applying an organic insulating material including photo acryl, the organic insulating material layer having a flat top surface;

exposing the organic insulating material layer to light through a photo mask, which includes a light-transmitting portion, a light-blocking portion and a half-light transmitting portion;

forming the first and second thicknesses and first, second, third and fourth holes by developing the organic insulating material layer exposed to light, the first, second, third and fourth holes exposing the first passivation layer corresponding to the common line, the drain electrode, the gate pad electrode and the data pad electrode, respectively; and forming the common contact hole and the first, second and third contact holes by removing the first passivation layer exposed by the first, second, third and fourth holes and the gate insulating layer under the first passivation layer.

8. The method according to claim 7, wherein the gate insulating layer, the first passivation layer and the third passivation layer are formed of an inorganic insulating material including silicon oxide or silicon nitride.

9. The method according to claim 6, wherein the second thickness is less than a half of the first thickness.

* * * * *